(12) United States Patent
Takahashi et al.

(10) Patent No.: US 9,599,647 B2
(45) Date of Patent: Mar. 21, 2017

(54) MONITORING AND CONTROLLING POWER SUPPLY APPARATUS AND METHOD

(75) Inventors: Shingo Takahashi, Tokyo (JP); Nobuhide Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 673 days.

(21) Appl. No.: 13/821,569

(22) PCT Filed: Aug. 18, 2011

(86) PCT No.: PCT/JP2011/069104
§ 371 (c)(1),
(2), (4) Date: Mar. 8, 2013

(87) PCT Pub. No.: WO2012/032938
PCT Pub. Date: Mar. 15, 2012

(65) Prior Publication Data
US 2013/0179102 A1    Jul. 11, 2013

(30) Foreign Application Priority Data

Sep. 10, 2010  (JP) ................................ 2010-202726

(51) Int. Cl.
*G01R 21/00*     (2006.01)
*G01R 21/133*    (2006.01)

(52) U.S. Cl.
CPC ........... *G01R 21/00* (2013.01); *G01R 21/133* (2013.01)

(58) Field of Classification Search
CPC ...... G01R 21/001; G01R 21/02; G01R 21/06; G01R 21/1336; G01R 21/1338; G01R 22/063; G01R 21/00; G01R 21/133

(Continued)

(56) References Cited

U.S. PATENT DOCUMENTS 7,643,369 B2    1/2010  Kaizu
7,853,816 B2 *  12/2010 Tanaka .......................... 713/323
(Continued)

FOREIGN PATENT DOCUMENTS

JP    10-044527    2/1998
JP    10-134558    5/1998
(Continued)

OTHER PUBLICATIONS

International Search Report PCT/JP2011/069104 dated Nov. 15, 2011, with English translation.
Korean Official Action—2012-532929—Jun. 2, 2015.

*Primary Examiner* — Sujoy Kundu
*Assistant Examiner* — Lynda Dinh
(74) *Attorney, Agent, or Firm* — Young & Thompson

(57) ABSTRACT

The purpose of the present invention is to provide a processing apparatus, which operates using a power supply that asynchronously supplies and stops supplying power, and a processing method. A processing apparatus (10) of the present invention is provided with: a power supply monitoring unit (20), which monitors power being supplied from a power supply that supplies power for a first period or more, at the time of supplying power of a first power value or more that is necessary for first processing, and which outputs first notification when the supplied power is at the first power value or more; and a processing unit (30), which operates with the power supplied from the power supply, and when the first notification is received, which completes the first processing within the first period by transiting to a first operation state, wherein the first processing can be performed, from a standby state, wherein supply of power of the first power value or more is not needed.

15 Claims, 6 Drawing Sheets

(58) Field of Classification Search
USPC .......................................................... 702/61
See application file for complete search history.

(56) References Cited

U.S. PATENT DOCUMENTS

2004/0239525 A1* 12/2004 Kobayashi ............... 340/870.16
2006/0057967 A1*  3/2006 Shimada .................... 455/67.13

FOREIGN PATENT DOCUMENTS

| JP | 2001-356844 | 12/2001 |
| JP | 2005-207773 |  8/2005 |
| JP | 2006-344235 | 12/2006 |
| JP | 2008-165536 |  7/2008 |
| JP | 2009-014659 |  1/2009 |
| JP | 2009-100282 |  5/2009 |
| JP | 2009-246597 | 10/2009 |

* cited by examiner

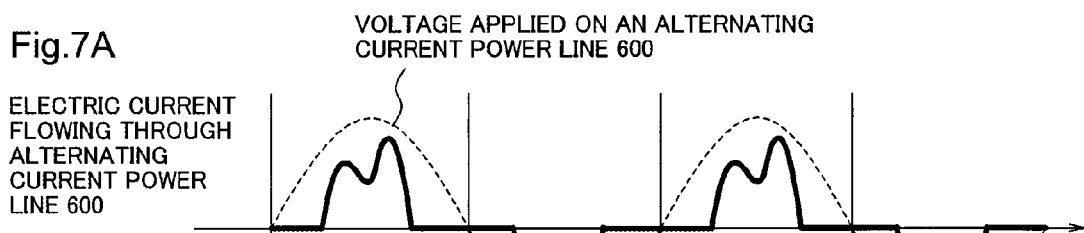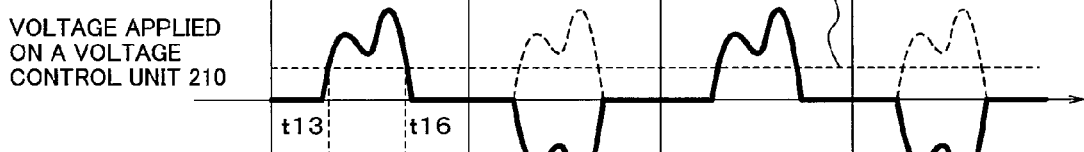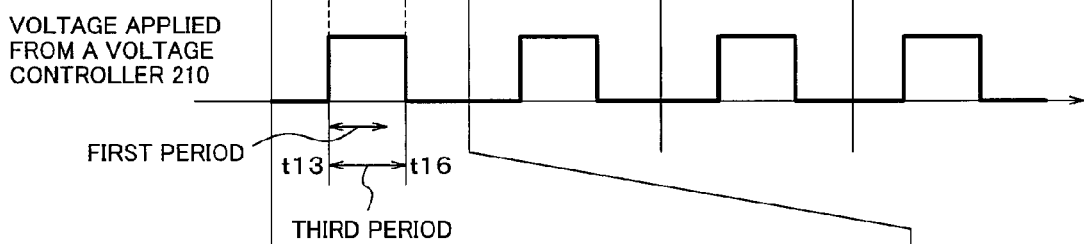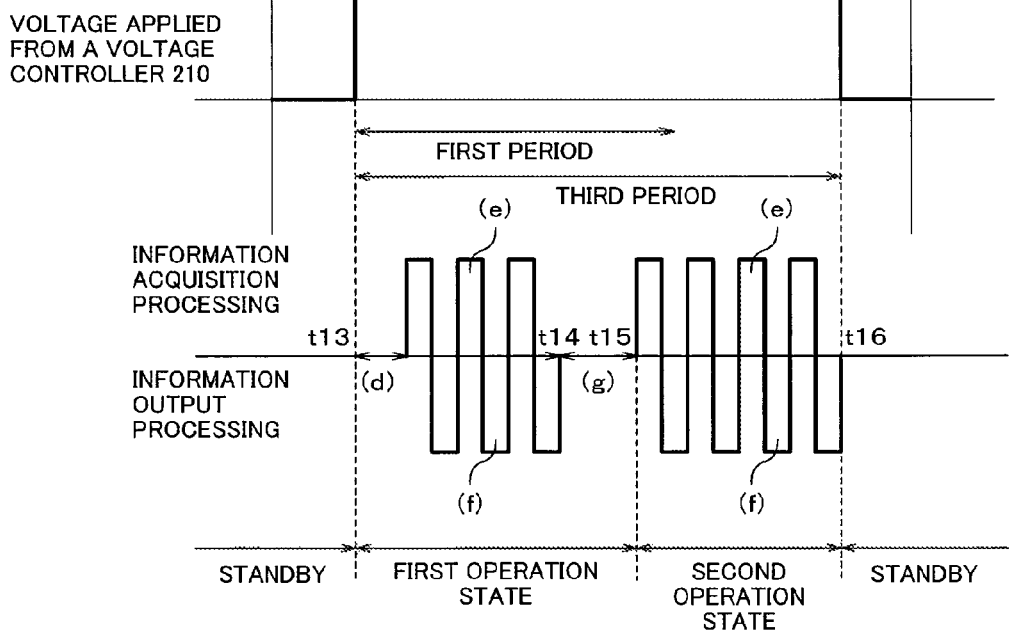

MONITORING AND CONTROLLING POWER SUPPLY APPARATUS AND METHOD

TECHNICAL FIELD

The present invention relates to a processing apparatus which operates using a power supply that asynchronously supplies and stops supplying power, and specifically relates to a processing apparatus which operates using a power supply that supplies power for a predetermined period at the time of supplying power.

BACKGROUND ART

A technology which takes environmental information or the like into an ICT (Information and Communication Technology) net such as the internet and an information processing system and utilizes has been developed.

For example, in a residence and an office, a system that power consumption of electrical appliances is measured and the user can always check the power consumption of a building has been developed.

A system to control a power supply using measured power consumption, and reduce power consumption automatically has been developed. A system which controls air-conditioning equipment, a lighting apparatus and a light shielding apparatus most suitably by making a measured value of power consumption cooperate with a measured value by such as a temperature sensor, humidity sensor and an illumination sensor has been also proposed.

In order to realize these systems, a finer granularity sensing technology which uses a lot of several kinds of sensor apparatuses becomes important. In the finer granularity sensing technology, cost cutting and a miniaturization of an apparatus become important.

For example, in order to perform a sensing with high accuracy, for a sensor apparatus equipped with a battery, a large capacity battery is required and periodical battery exchange is needed. Cost becomes high when using a large capacity battery. Because the periodical battery exchange is needed, convenience is low.

Accordingly, various technologies for obtaining an electric power from an existing alternating current power network are proposed. For example, a technology which performs smooth stabilization of alternating current power acquired from an alternating current power network and acquires direct-current electricity is proposed by patent document 1. An apparatus of power-saving which supplies an electric power to a radio communication control unit only for a communication period is proposed by patent document 2.

PRIOR ART DOCUMENT

Patent Document patent document 1: Japanese Patent Application Laid-Open No. 2009-14659
patent document 2: Japanese Patent Application Laid-Open No. 2009-246597

BRIEF SUMMARY OF THE INVENTION

Problems to be Solved by the Invention

The technology of patent document 1 needs a large capacity capacitor for smooth stabilization to acquire stable direct-current electricity from an alternating current power network. When applying the technology of patent document 1 to an apparatus driven by a voltage greater than a predetermined voltage value, the convenience thereof is high because a battery is not needed and thereby it is not necessary to exchange a battery periodically. However, because the technology of patent document 1 needs a smooth stabilizer such as a large capacity capacitor, an apparatus becomes large and the production cost becomes high.

An apparatus of patent document 2 needs to manage a period of supplying an electric power to a radio communication control unit. It is always needed to supply electric power for operating the circuit for time measurement during the period when a radio communication control unit does not communicate.

The purpose of the present invention is to provide a processing apparatus using a power supply that asynchronously supplies and stops supplying power and a processing method.

Means for Solving the Problems

In order to achieve the above-mentioned purpose, a processing apparatus of the present invention is provided with: a power supply monitoring unit, which monitors power being supplied from a power supply that supplies power for a first period or more, at the time of supplying power of a first power value or more that is necessary for first processing, and which outputs first notification when the supplied power is at the first power value or more; and a processing unit which operates with the power supplied from the power supply, and when the first notification is received, which completes the first processing within the first period by transiting to a first operation state, wherein the first processing can be performed, from a standby state, wherein supply of power of the first power value or more is not needed.

In order to achieve the above-mentioned purpose, a processing method according to the present invention monitors supplied power being supplied from a power supply that supplies power for a first period or more, at the time of supplying power of a first power value or more that is necessary for first processing, and outputs first notification when the supplied power is at the first power value or more. And when the first notification is outputted, the first processing is completed within the first period by transiting to a first operation state, wherein the first processing can be performed, from a standby state, wherein supply of power of the first power value or more is not needed.

Effect of the Invention

In the processing apparatus of the present invention, the power which is the first power value or more is supplied from the power supply that supplies power for a first period or more, and the first processing can be completed within the first period. Therefore, even if the supply and the stop of the power supply are performed asynchronously, the processing apparatus of the present invention can normally perform the first processing and can complete the processing thereof.

In the processing apparatus of the present invention, a power supply may be supplied only for a predetermined period beyond a period in which the first processing should be performed, and it is not necessary to supply a power at all times.

The processing apparatus of the present invention starts the first processing after detecting supplying the first power and completes the processing thereof within the period in which the first power is supplied. Accordingly, the processing apparatus of the present invention does not need to provide a smooth stabilization circuit or the like, and miniaturization and cost reduction of the apparatus are realized.

BRIEF DESCRIPTION OF THE DRAWINGS

FIG. 7 is a time chart showing an example of an operation of the sensor apparatus 200 according to the third exemplary embodiment.

MODE FOR CARRYING OUT THE INVENTION

First Exemplary Embodiment

A processing apparatus according to a first exemplary embodiment will be described. The processing apparatus according to this exemplary embodiment operates with supplied power from a predetermined external power supply (hereinafter, described an external power supply) which is not illustrated. When supplying a power of a predetermined first power value or more, the external power supply supplies it for a predetermined first period or more.

Here, "the first power value" is the smallest supplied power value or more that is necessary for a processing unit 30 described later to perform first processing. "The first period" is a time longer than a required time for the processing unit 30 to complete the first processing. That is, the external power supply does not always supply a fixed electric power, but it supplies the first power value or more only for a period that is required for the processing unit 30 to complete the first process.

Figure 1:
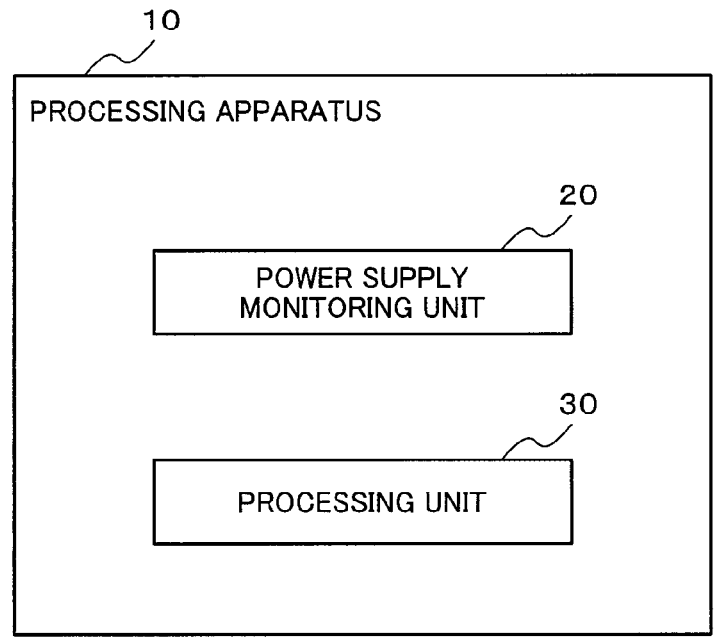
FIG. 1 is an example of a block diagram of a processing apparatus 10 according to a first exemplary embodiment.

An example of a block diagram of the processing apparatus according to this exemplary embodiment is shown in FIG. 1. In FIG. 1, a processing apparatus 10 includes a power supply monitoring unit 20 and a processing unit 30.

The power supply monitoring unit 20 monitors supplied power supplied from the above-mentioned external power supply. When the supplied power supplied from the external power supply becomes a first power value or more (the smallest supplied power value or more that is required for the processing unit 30 to perform the first processing), the power supply monitoring unit 20 generates a first notification and outputs it to the processing unit 30.

The processing unit 30 transits from a standby to a first operation state and starts the first processing, when receiving the first notification from the power supply monitoring unit 20. The processing unit 30 completes the first processing before the first period ends and transits to the standby state again.

Here, "the first operation state" is in a state where supplying power of the first power value or more is required and in that the processing unit 30 can perform the first processing. On the other hand, "the standby state" is in a state where supplying power of the first power value or more is not needed. In the standby state, even if the power of the first power value or more is supplied to the processing unit 30, there are no problems. The processing speed of the processing unit 30 is set highly sufficiently in advance based on contents of the first processing and the first period in order to complete the first processing before the first period ends.

Figure 2:
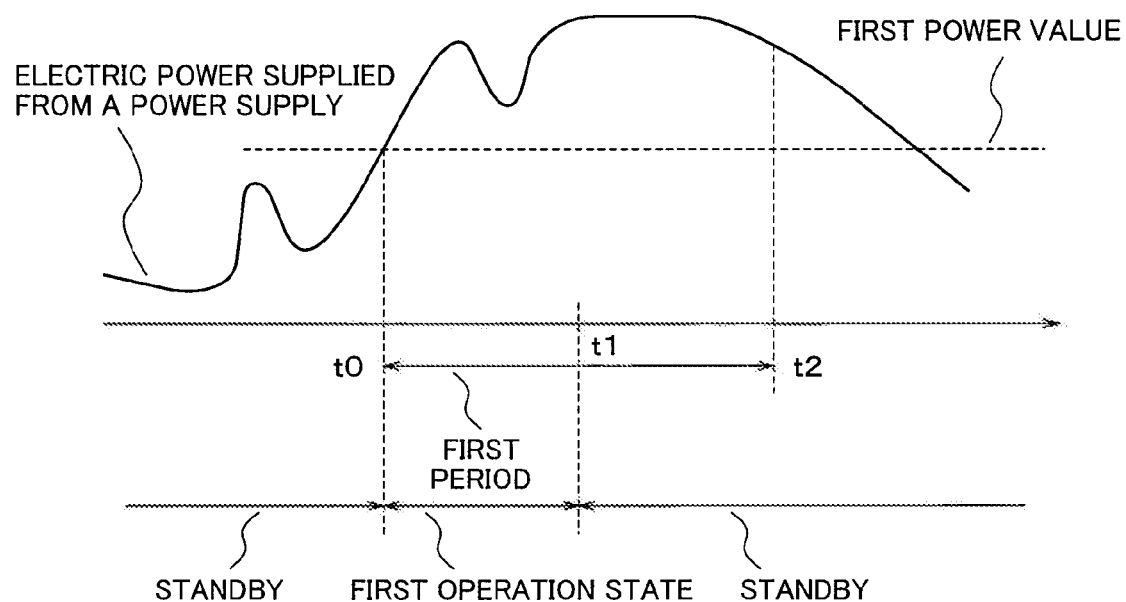
FIG. 2 is a time chart showing an example of an operation of the processing apparatus 10 according to the first exemplary embodiment.

An example of a time chart showing operation of the processing apparatus 10 according to this exemplary embodiment is shown in FIG. 2. The supplied power is supplied from the external power supply and the power supply monitoring unit 20 is monitoring the supplied power. In FIG. 2, when the supplied power becomes the first power value or more (time t0), the power supply monitoring unit 20 generates the first notification and outputs it to the processing unit 30.

When receiving the first notification from the power supply monitoring unit 20 (time t0), the processing unit 30 transits from the standby state to the first operation state. The processing unit 30 performs the first processing within the first period (t0-t2), and transits to the standby state from the first operation state when the first processing is completed (time t1).

As mentioned above, the processing apparatus 10 according to this exemplary embodiment transits to the first operation state in the first period when the power of the first power value or more is supplied and completes the first processing. Therefore, even if supply and stop of the power supply are performed asynchronously, the processing apparatus 10 can normally perform the first processing and can complete the processing thereof. In the processing apparatus 10, a power supply may be supplied only for a predetermined period beyond a period in which the first processing should be performed, and it is not necessary to supply a power thereto at all times.

Because the processing apparatus 10 starts the first processing when the supplied power becomes the first power value or more, and completes the processing thereof within the first period, it does not need to provide therein a smooth stabilization circuit or the like to maintain supply of the first power value or more. Accordingly, miniaturization and cost reduction of the processing apparatus 10 can be realized.

Further, when the supply capability of the external power supply is not enough, and power consumption of the processing unit 30 performing the first processing cannot be ignored, the first power value is determined in consideration of difference of the power consumption of the processing unit 30 while performing the first processing and the power consumption of the processing unit 30 while stopping the first processing. Specifically, the power supply monitoring unit 20 should just monitor by making into a reference value the power value that has added the difference to the first power value.

In this exemplary embodiment, although the supply capability of the external power supply was monitored, the power supply monitoring unit 20 can monitor the output voltage and supply current of the external power supply.

Second Exemplary Embodiment

Figure 3:
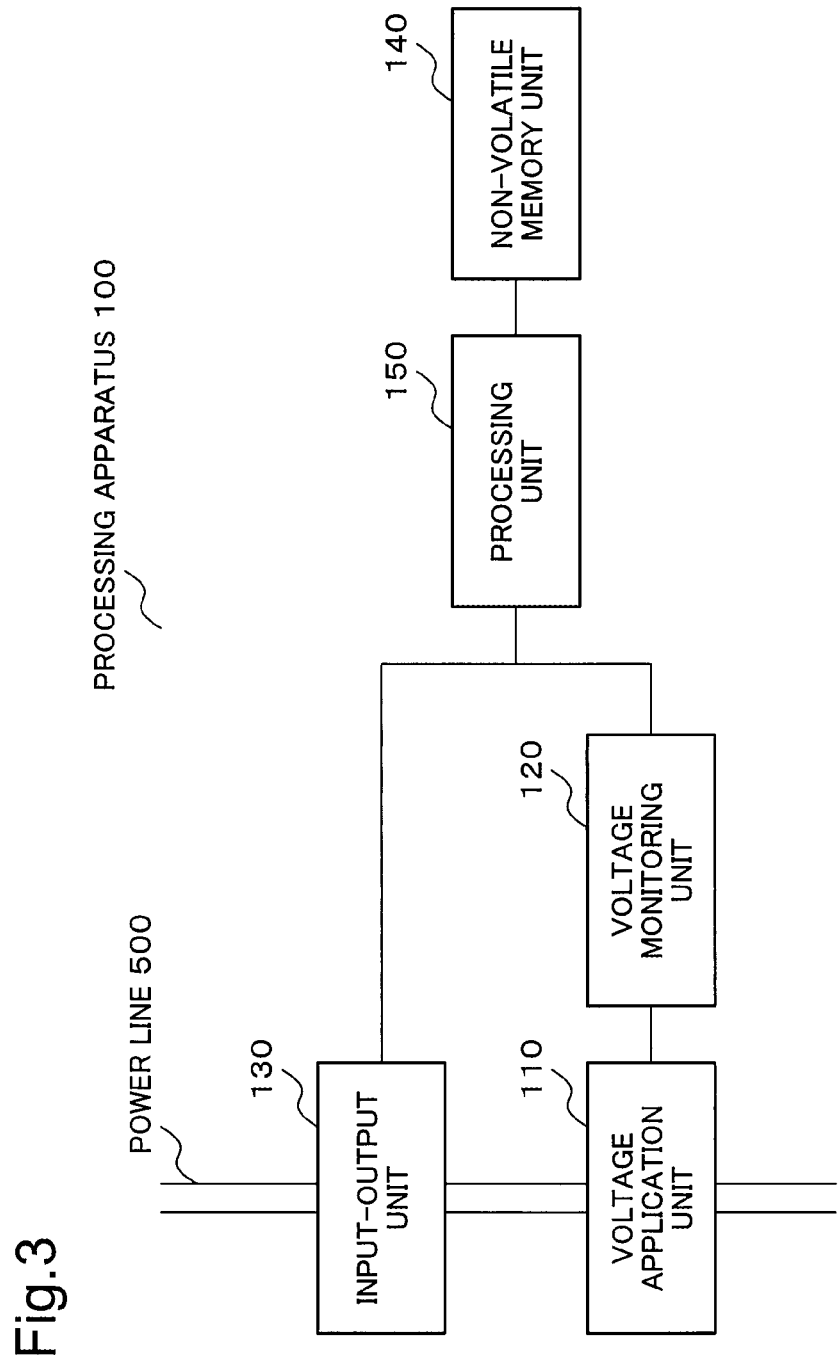
FIG. 3 is an example of a block diagram of a processing apparatus 100 according to a second exemplary embodiment.

A second exemplary embodiment will be described. An example of a block diagram of a processing apparatus 100 according to this exemplary embodiment is shown in FIG. 3. In FIG. 3, the processing apparatus 100 according to this exemplary embodiment includes a voltage application unit 110, a voltage monitoring unit 120, an input-output unit 130, a non-volatile memory unit 140 and a processing unit 150.

A voltage is applied via a power line 500 from a predetermined power supply, and the voltage application unit 110 applies the voltage applied thereto on each unit of the processing apparatus 100. Here, when a voltage of a first voltage value or more is applied, the predetermined power supply applies it for a first period or more.

The voltage monitoring unit 120 holds the first voltage value and monitors the voltage applied on the voltage application unit 110. When the voltage applied on the voltage application unit 110 becomes the first voltage value or more, the voltage monitoring unit 120 outputs a first notification to the processing unit 150. The first voltage value is the voltage value more than the minimum applied voltage required in order that the processing unit 150 may perform first processing.

The input-output unit 130 acquires desired information from outside during the first period at least and transmits the acquired information to outside via the power line 500. Information which the input-output unit 130 acquired and information required for a next operation are registered in the non-volatile memory unit 140.

The processing unit 150 transits from a standby state to a first operation state and starts the first processing, when it receives the first notification from the voltage monitoring unit 120. In this exemplary embodiment, after the first processing is completed, the processing unit 150 transits from the first operation state to the second operation state, and it performs second processing. The processing unit 150 transits from the second operation state to the standby state when the applied voltage falls below the first voltage value in the second operation state.

Here, "the second processing" is a processing which can be stopped while processing. "The first operation state" is in the state where the first power value or more is required and the first processing can be performed. "The standby state" is in the state where the applied voltage of the first voltage value or more is not needed. "The second operation state" is in the state of performing the second processing corresponding to the applied voltage and in the state of transiting to a standby state automatically with a fall of the applied voltage.

The processing unit 150 performs processing (a), (b) and (c) as the first processing and performs a processing (b) as the second processing. The processing (a) is a processing to confirm information registered in the non-volatile memory unit 140. The processing (b) is a processing to acquire desired information by controlling the input-output unit 130 and to output information acquired via the power line 500 to outside. The processing (c) is a processing to register information required when operating next in the non-volatile memory unit 140.

Figure 4:
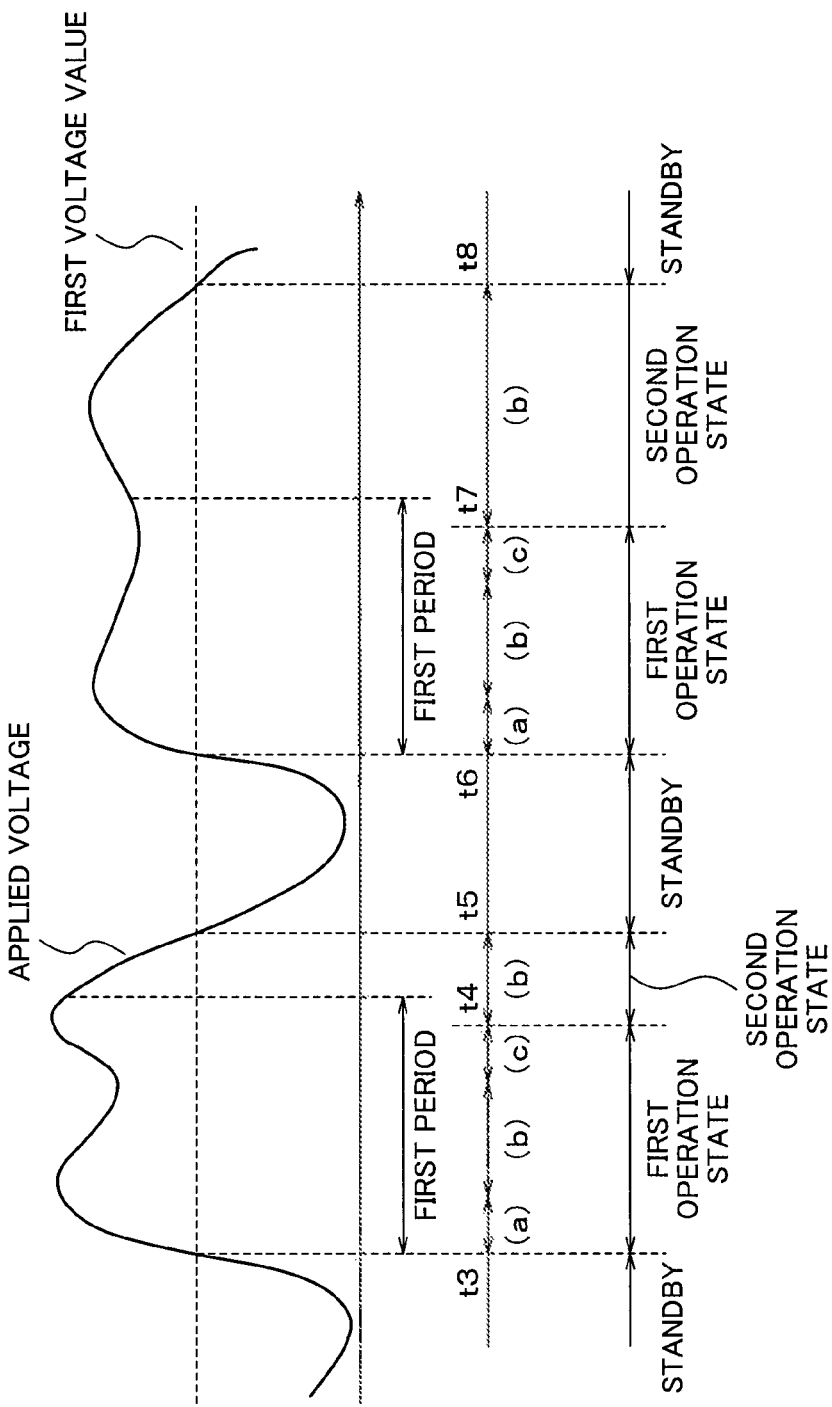
FIG. 4 is a time chart showing an example of an operation of the processing apparatus 100 according to the second exemplary embodiment.

An operation of the processing apparatus 100 according to this exemplary embodiment will be described. An example of a time chart of an operation of the processing apparatus 100 is shown in FIG. 4. In FIG. 4, the voltage monitoring unit 120 monitors the applied voltage applied on the voltage application unit 110, and outputs a first notification to the processing unit 150 when the applied voltage becomes the first voltage value or more (time t3).

When receiving the first notification form the voltage monitoring unit 120 (time t3), the processing unit 150 transits from the standby state to the first operation state and starts the first processing. In other words, the processing unit 150 confirms whether information is registered in the non-volatile memory unit 140, and confirms the information (processing (a)) when information is registered in it. Next, the processing unit 150 acquires desired information by controlling the input-output unit 130, and transmits the acquired information to outside via the power line 500 (processing (b)). The processing unit 150 investigates the input-output unit 130 for whether after transmission and reception of the used information are completed, there is any information required when operating next, and when there is any information required when operating next, it registers it in the non-volatile memory unit 140 (processing (c)).

The processing unit 150 transits from the first operation state to the second operation state when the first processing (processing (a), (b) and (c)) is completed (time t4). In the second operation state, the processing unit 150 performs the processing (b) as the second processing that can be stopped while processing. When the applied voltage applied from the power supply falls below the first voltage value (time t5), the processing unit 150 stops processing (b) as the second processing and transits from the second operation state to the standby state.

The voltage monitoring unit 120 outputs the first notification again, when the voltage applied on the voltage application unit 110 exceeds the first voltage value again (time t6) after it fell below the first voltage value. The processing unit 150 performs the first processing in the first operation state (t6-t7) and performs the second processing in the second operation state (t7-t8).

As mentioned above, the processing apparatus 100 according to this exemplary embodiment transmits and receives information only in a period when the voltage applied on the voltage application unit 110 via the existing power line 500 is bigger than the first voltage value. In this case, the processing apparatus 100 does not need a battery and a smooth stabilizer and the processing apparatus 100 of small size can be provided.

Moreover, introduction cost of the processing apparatus 100 can be made low, because acquisition of voltage and transmission of information are performed via the existing power line 500.

After completing minimum necessary processing (the first processing), the processing apparatus 100 according to this exemplary embodiment transits from the first operation state to the second operation state and continues information acquisition processing and information output processing as the second processing that can be stopped while processing. Therefore, it is avoidable that the processing apparatus 100 suffers damage when supplied voltage falls in the middle of processing, and information acquired and outputted can be increased.

Modification of the Second Exemplary Embodiment

A modification of the second exemplary embodiment will be described. In this exemplary embodiment, instead of outputting the first notification when the applied voltage value becomes the first voltage value or more, the voltage monitoring unit 120 outputs the second notification to the processing unit 150 when the applied voltage becomes a predetermined ratio of the first voltage value.

In this exemplary embodiment, as the predetermined ratio of the first voltage value, 80% value of the first voltage value is used. Hereinafter, the predetermined ratio value of the first voltage value is described as a second voltage value. The second voltage value can be set appropriately corresponding to the characteristics or the like of a power supply which applies a voltage.

Figure 5:
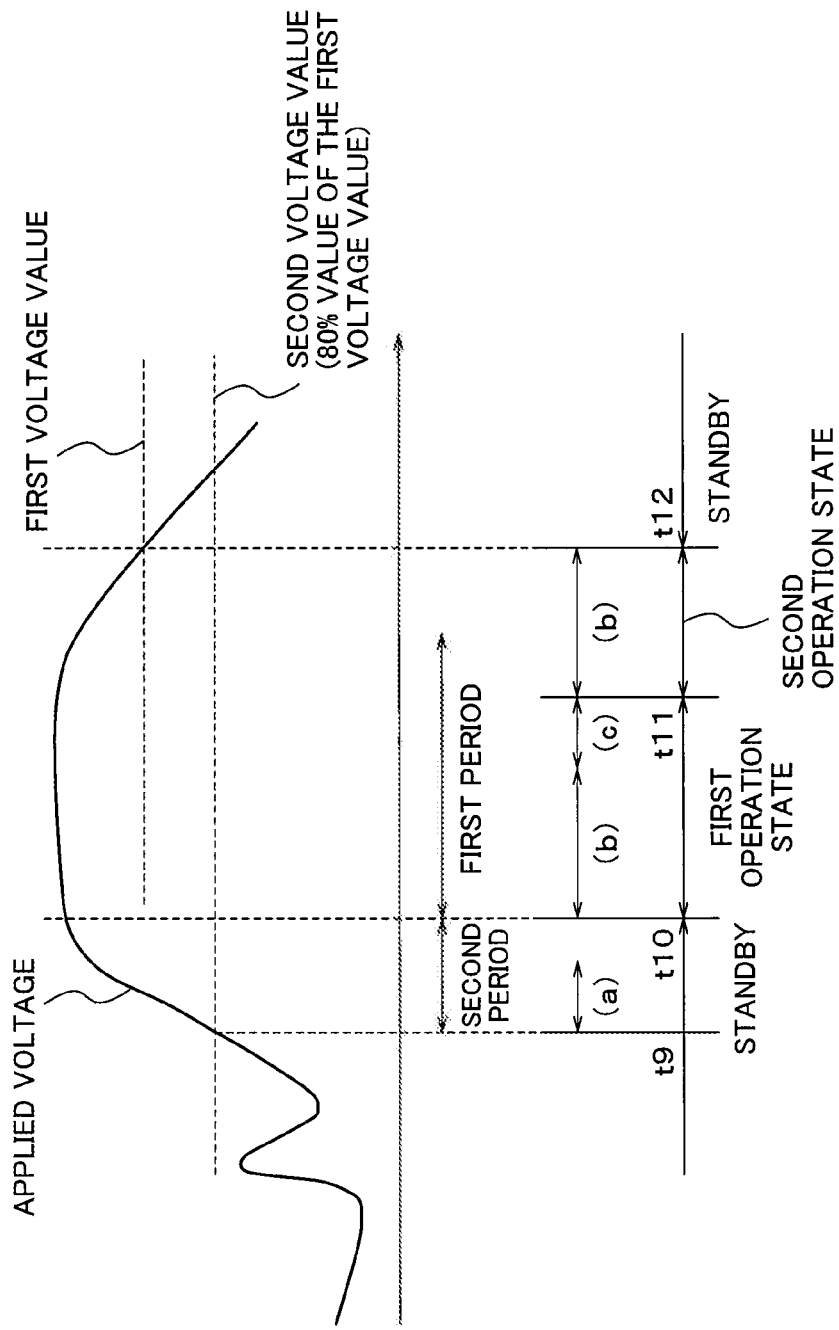
FIG. 5 is a time chart showing an example of an operation of a processing apparatus according to a modification of the second exemplary embodiment.

An example of a time chart of an operation of the processing apparatus 100 according to this exemplary embodiment is shown in FIG. 5. In this exemplary embodiment, the voltage monitoring unit 120 outputs the second notification to the processing unit 150, when the applied voltage applied from a power supply is 80% value (the second power value) of the first voltage value (time t9).

When receiving the second notification, the processing unit 150 starts to clock the second period (t9-t10) in the standby state and performs the above-mentioned processing (a) whose power consumption is relatively small. When the second period has passed (time t10), the processing unit 150 judges that the applied voltage reaches the first voltage value and transits from the standby state to the first operation state, and performs the above-mentioned processing (b) and (c). When the first processing has completed (time t11), the processing unit 150 transits from the first operation state to the second operation state, and performs the processing (b) as the second processing. When the applied voltage falls below the first voltage value (time t12), it transits from the second operation state to the standby state.

In this case, the processing unit 150 can perform a certain processing which does not need much power consumption before the applied voltage reaches the first voltage value. Accordingly, the first period in which the applied voltage is high can be used effectively as a period for performing processing such as information acquisition and information output that power consumption is large, and the first period can be set lengthily.

Further, after the processing unit 150 clocks the second period, it is not limited to transit from the standby state to the first operation state. When the applied voltage exceeds the first voltage value, the voltage monitoring unit 120 outputs the first notification to the processing unit 150, and when receiving the first notification, the processing unit 150 can transit to the first operation state.

In this exemplary embodiment, although it stopped the second processing and transited from the second operation state to the standby state when the applied voltage fell below the first voltage value, it is not limited to this. For example, when the applied voltage falls below the first voltage value, it transits from the second operation state to the standby state, and the above-mentioned processing (c) that power consumption is relatively small in the standby state can be performed again.

Third Exemplary Embodiment

Figure 6:
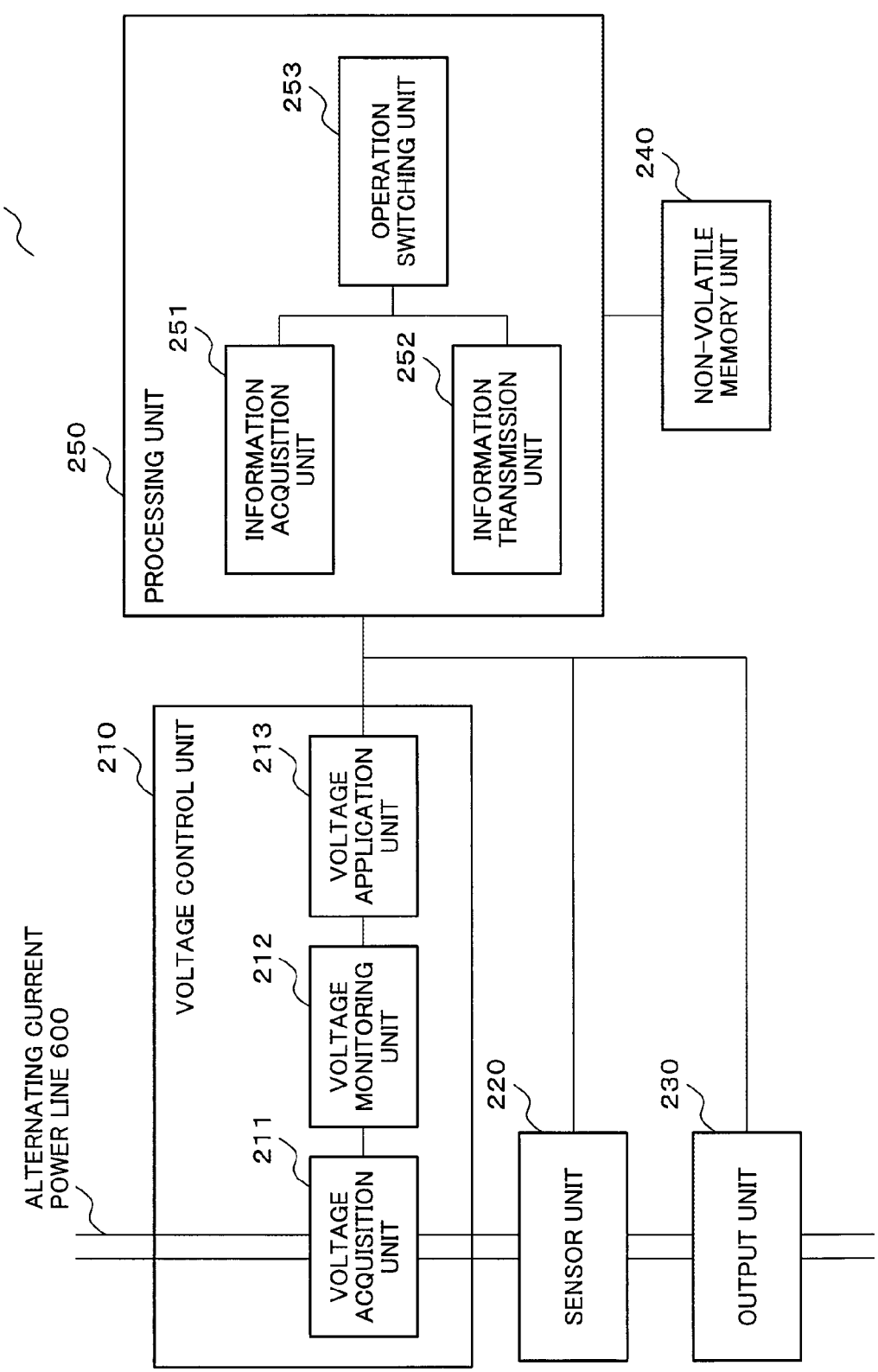
FIG. 6 is an example of a block diagram of a sensor apparatus 200 according to a third exemplary embodiment.

A third exemplary embodiment will be described. An example of a block diagram of a sensor apparatus according to this exemplary embodiment is shown in FIG. 6. In FIG. 6, a sensor apparatus 200 according to this exemplary embodiment includes a voltage control unit 210, a sensor unit 220, an output unit 230, a non-volatile memory unit 240 and a processing unit 250.

The voltage control unit 210 monitors a voltage applied via an alternating current power line 600 from an existing alternating current power network and applies a voltage on each part of the sensor apparatus 200. In FIG. 6, the voltage control unit 210 includes a voltage acquisition unit 211, a voltage monitoring unit 212 and a voltage application unit 213.

A voltage is applied on the voltage acquisition unit 211 via the alternating current power line 600 from the existing alternating current power network. In this exemplary embodiment, the voltage acquisition unit 211 acquires a voltage corresponding to the electric current which flows through the alternating current power line 600 by forming with a transformer which makes the alternating current power line 600 side a primary side.

The voltage monitoring unit 212 keeps the first voltage value and outputs the first notification to the processing unit 250 and the voltage application unit 213 when the applied voltage applied on the voltage acquisition unit 211 becomes the first voltage value or more. When receiving the first notification from the voltage monitoring unit 212, the voltage application unit 213 applies a voltage on each part of the sensor apparatus 200 for a third period longer than the first period.

The sensor unit 220 measures data about the environment around the sensor apparatus 200 and transmits the measurement data to the processing unit 250. In this exemplary embodiment, a current sensor is applied as the sensor unit 220. The sensor unit 220 includes a transformer which makes the alternating current power line 600 side a primary side, measures an electric current which flows through the alternating current power line 600 and inputs it to the processing unit 250.

The output unit 230 is provided with a PLC (Power Line Communication) interface which makes the alternating current power line 600 a transmission line and outputs a measurement result of the current value that the sensor unit measured or environmental information registered with the non-volatile memory unit 240 to outside through the existing alternating current power network from the alternating current power line 600.

Environmental information which the processing unit 250 stored and information which is needed for a next operation are registered in the non-volatile memory unit 240.

As shown in FIG. 6, the processing unit 250 includes an information acquisition unit 251, an information transmission unit 252 and an operation switching unit 253. The information acquisition unit 251 converts measurement data of the current value of the acquired alternating current power line 600 from the sensor unit 220 to digital data and inputs to the information transmission unit 252 as a measurement result of the current value.

When there is a measurement result for needing to output repeatedly, the information acquisition unit 251 stores it in the non-volatile memory unit 240 as environmental information. The information transmission unit 252 outputs a measurement result of the current value inputted from the information acquisition unit 251 or environmental information stored in the non-volatile memory unit 240 by controlling the output unit 230 to outside through the existing alternating current power network from the alternating current power line 600. The operation switching unit 253 changes operation of the information acquisition unit 251 and the information transmission unit 252. The operation switching unit 253 changes them in the period in which the information acquisition unit 251 and the information transmission unit 252 can complete the operation and in a period as short as possible.

When receiving the first notification from the voltage control unit 210, the processing unit 250 transits from the standby state to the first operation state and starts the first processing. In this exemplary embodiment, as the first processing, the processing unit 250 performs a confirmation processing (processing (d)) of information stored in the non-volatile memory unit 240, information acquisition processing (processing (e)) by the information acquisition unit 251, information output processing (processing (f)) by the information transmission unit 252 and registration processing (processing (g)) of information which is needed for a next operation. After completing the first processing, the processing unit 250 transits from the first operation state to the second operation state, and performs processing (e) and (f) as the second processing. And when the applied voltage from the voltage control unit 210 falls, it stops the second processing and transits from the second operation state to the standby state.

An example of a time chart of processing of the sensor apparatus 200 according to this exemplary embodiment is shown in FIG. 7. In FIG. 7(a), an example of a waveform of alternating voltage applied on the alternating current power line 600 from the existing alternating current power network is shown by a dotted line. An example of a waveform of alternating current which flows through the alternating current power line 600 by connecting an electrical apparatus (not shown) which operates by the alternating voltage with the alternating current power line 600 is shown by a solid line in FIG. 7(a). The current which flows through the alternating current power line 600 has a different waveform depending on electrical apparatus.

An example of a waveform of voltage applied on the voltage control unit 210 from the alternating current power line 600 is shown in FIG. 7(b). An example of a waveform of voltage which the voltage control unit 210 applies is shown in FIG. 7(c). An example of an operation of the processing unit 250 in any third period is shown in FIG. 7(d).

In FIG. 7(a), when the alternating voltage of the sinusoidal wave shown by the dotted line is applied on the alternating current power line 600 which connects the existing alternating current power network and the voltage control unit 210, and the current shown by the solid line is flowing, the voltage shown by the solid line of FIG. 7 (b) is applied on the voltage acquisition unit 211 of the voltage control unit 210. And when the voltage applied on the voltage acquisition unit 211 becomes the first voltage value or more (time t13), the voltage monitoring unit 212 outputs the first notification to the processing unit 250 and the voltage application unit 213.

The voltage application unit 213 of the voltage control unit 210 applies the voltage shown in FIG. 7(c) on each part of the sensor apparatus 20 for the third period (t13-t16), when receiving the first notification from a voltage monitoring unit 212 (the time t13). Here, the third period is a period longer than the first period.

On the other hand, when receiving the first notification from the voltage monitoring unit 212 of the voltage control unit 210 (the time t13), as shown in FIG. 7 (d), the processing unit 250 transits from the standby state to the first operation state and performs the first processing (processing (d)-(g)).

In this exemplary embodiment, in the first operation state, the processing unit 250 performs the confirmation processing (processing (d)) of information registered last time. And when changing the information acquisition unit 251 and the information transmission unit 252 by the operation switching unit 253, the processing unit 250 performs information acquisition processing (processing (e)) and information output processing (processing (f)) repeatedly. The processing unit 250 confirms whether there is required information for next operation, when the decided number of times with the processing (e) and the processing (f) is repeated (the time t14), and the processing unit 250, when there is information thereof, registers it into the non-volatile memory unit 240 (processing (g)).

When the first processing (processing (d), (e), (f) and (g)) has completed (the time as), it transits from the first operation state to the second operation state. In the second operation state, the processing unit 250 repeats the processing (e) and (f) until the third period ends.

Here, in the period when the information acquisition unit 251 and the information transmission unit 252 can complete each operation and in a period as short as possible, the operation switching unit 253 changes them two or more times. In this case, environmental information can be outputted to outside promptly after acquisition, and lost environmental information can be suppressed in a minimum even when a power flicker or the like that the applied voltage becomes sudden low occurs. When the third period ends, and the applied voltage from the voltage control unit 210 declines (the time t16), the processing unit 250 stops the second processing and transits from the second operation state to the standby state.

In this case, a minimal processing is complete in the first operation state and future's sensor operation is not influenced. And even when the second operation stops without the enough applied power in the middle of the second operation, information which is acquired and transmitted can be increased by repeating acquisition and transmission operation in the second operation state.

As mentioned above, the sensor apparatus 200 according to this exemplary embodiment performs acquisition and output of environmental information only in the period when the voltage applied from the existing alternating current power network is the first voltage value or more. In this case, a battery and a smooth stabilizer for generating stable direct-current voltage from alternating current power supply do not need to be provided in the sensor apparatus 200. Accordingly, the small sensor apparatus 200 which does not require an establishment of a battery and a smooth stabilizer can be provided. Because acquisition of a voltage and output of information are performed via the existing alternating current power line 600, introduction cost of the sensor apparatus 200 can be reduced.

The sensor apparatus 200 according to this exemplary embodiment can output acquired environmental information to outside promptly by changing acquisition operation and output operation of environmental information in a period as short as possible. Accordingly, even when a power flicker or the like occurs, lost environmental information can be suppressed in a minimum.

In this exemplary embodiment, although the current sensor which was composed by a transformer which makes the alternating current power line 600 side a primary was used as the sensor unit 220, it is not limited to this. As a sensor unit 220, a temperature sensor which measures a temperature of ambient surroundings of the sensor apparatus 200, a humidity sensor which measures a humidity of ambient surroundings and an illumination sensor or the like which measures an illumination intensity of ambient surroundings can be applied.

In this exemplary embodiment, although the output unit 230 is provided with a PLC interface and it outputs environmental information to outside via the existing alternating current power network, it is not limited to this. For example, a radio interface, a wired interface and an infrared ray interface or the like can be applied.

In this exemplary embodiment, as shown in FIG. 7(b), although a predetermined processing was performed when the absolute value of the applied voltage was the first voltage value or more, for example, it may be performed only when a voltage on the plus side of the alternating voltage is the first voltage value or more.

In FIG. 7(c), although the voltage which the voltage control unit 210 applies were described by a rectangle, after the first period passes depending on the state of the voltage applied from the alternating current power line 600, the voltage which the voltage control unit 210 applies may decline on the on the way. In this case, the processing 250 stops the second processing at time when the voltage declines and transits from the second operation state to the standby state.

Modification of the Third Exemplary Embodiment

A modification of the third exemplary embodiment will be described. In this exemplary embodiment, the sensor unit 220 outputs the output voltage of the sensor unit 220 as well as a measurement result about the environment around the sensor apparatus 200 to the processing unit 250.

The processing unit 250, keeping the third voltage value, starts the above-mentioned processing (d) when receiving the first notification from the voltage control unit 210 (time t13 of FIG. 7) and starts to compare the output voltage received from the sensor unit 220 and the third voltage value. And when the output voltage of the sensor unit 220 exceeds the third voltage value, processing (e), (f) and (g) are performed.

That is, when receiving the first notification, the processing unit 250 according to this exemplary embodiment performs only processing (d) which does not use the measurement result of the sensor unit 220, and when the output voltage of the sensor unit 220 exceeds the third voltage value, it starts processing (e) which uses the measurement result of the sensor unit 220.

Because the voltage control unit 210 begins to apply voltage to each unit from the time t13, and the sensor unit 220 begins to measure from the time t13, the processing unit 250 postpones the processing for the measurement result of the sensor unit 220 until the sensor unit 220 begins to transmit the measurement result. In this case, it can be suppressed to acquire a measurement result with a high invalid possibility and it can be avoided to be consumed an electric power wastefully.

Here, although the part or everything of the above-mentioned exemplary embodiment can also be described like the following notes, but not limited to the followings.

(Note 1) An apparatus including: a power supply monitoring unit which monitors a power supply supplied a first power or more for a first period or more, and detects that the power of the power supply becomes first power or more; and a processing unit which transits to the operation state when the power of the power supply becomes the first power or more and starts processing, and completes the processing within the first period and transits to the standby state.

(Note 2) The apparatus according to note 1, wherein characterized in that the power supply monitoring unit measures a voltage of the power supply, and detects that the voltage of the power supply is first voltage value or more decided by the first power.

(Note 3) The apparatus according to note 1 or note 2 including: an output unit which outputs a result of the processing to outside within the first period.

(Note 4) The apparatus according to any one of notes 1 to 3 including a non-volatile memory unit capable of holding of information after cutting of the power supply is performed, wherein the processing unit stores the result of the processing in the non-volatile memory unit within the first period.

(Note 5) The apparatus according to note 4, wherein the power supply repeats the supply of the first voltage value or more, and the cutting thereof, and processing unit performs the processing using the result of the processing stored in the non-volatile memory unit when transiting to the operation state.

(Note 6) The apparatus according to any one of notes 1 to 5, wherein the power supply monitoring unit judges that the voltage of the power supply is the first voltage value or more, when the second period passes after detecting the voltage of the power supply being the second voltage below the first voltage value.

(Note 7) The apparatus according to any one of notes 1 to 6, wherein the power supply monitoring unit generates the power supply voltage intermittently at timing which synchronizes with the cycle of the alternating current of the power line from the power line in which alternating current power flows.

(Note 8) The apparatus according to note 7, wherein the power supply monitoring unit includes a voltage acquisition unit which acquires an electric power from the power line, an alternating current cycle detecting unit which generates a signal at timing which synchronizes with an alternating current power waveform of the power line and an electric power transmitting unit which controls electric power transmission to the processing unit.

(Note 9) The apparatus according to any one of notes 1 to 8 including a sensor unit having a function to acquire surrounding environmental information, wherein the processing unit performs the processing using a sensor power from the sensor unit within the first period.

(Note 10) The apparatus according to note 9, wherein the processing unit transits to the operation state and begins the processing when the processing unit detects that the sensor power is becomes a third voltage within the first period.

(Note 11) The apparatus according to any one of notes 1 to 10, wherein the processing unit completes data acquisition operation which acquires sensor information within the first period and data transmission operation which transmits information acquired by the sensing operation.

(Note 12) The apparatus according to note 11, wherein the processing unit repeats the data acquisition operation and the data transmission operation alternately at least one or more until the voltage of the power supply falls below the first voltage value even if the first period ends.

(Note 13) The apparatus according to note 11 or note 12, wherein the processing unit includes a data acquisition section which performs the data acquisition operation, a data transmission unit which performs the data transmission operation and an operation switching unit which asynchronously controls the data acquisition section and the data transmission unit.

(Note 14) The apparatus according to any one of notes 1 to 13, wherein the processing unit converts the sensor power into the digital value in the data acquisition operation, starts the data transmission operation at the same time completing the conversion, and transmits the digitalized sensor power via the output unit.

(Note 15) The apparatus according to any one of notes 1 to 14, wherein the processing unit performs the data transmission operation in spite of presence or absence of an apparatus which receives transmitted data.

(Note 16) The apparatus according to any one of notes 1 to 15, wherein the sensor unit uses a current sensor including a transformer which makes the power line a primary.

(Note 17) The apparatus according to any one of notes 1 to 15, wherein the sensor unit uses a sensor having an acquisition function of surrounding environmental information.

(Note 18) The apparatus according to any one of notes 1 to 17, wherein the output unit includes an interface for communication which makes the power line a transmission line.

(Note 19) The apparatus according to any one of notes 1 to 17, wherein the output unit has a data communication function using a transmission line different from the power line.

(Note 20) An apparatus control method comprising: a step of monitoring a power supply supplied a first voltage value or more for a first period or more; a step of starting processing by transiting an operation state when detecting that a voltage of the power supply becomes a first voltage value; and a step of ending the processing within the first period and transiting the standby state that the power supply can be cut.

(Note 21) The apparatus control method according to note 20 comprising: a step of transiting an operation state which performs processing of the data acquisition step and the data transmission step each once respectively within the first period; and a step of transiting a standby state which repeats the data acquisition step and the data transmission step alternately.

Although a suitable exemplary embodiment of the present invention has been described above, it is only mere illustration and does not limit the present invention at all. In the range that does not deviate from a point, various modifications are possible for the present invention.

This application insists on priority based on Japanese Patent Application No. 2010-202726 applied on Sep. 10, 2010 and takes in everything of the disclosure here.

INDUSTRIAL APPLICABILITY

As an example of utilization of the present invention, an apparatus which gets an electric power from an existing alternating current power network and performs a predetermined processing is mentioned.

DESCRIPTION OF SYMBOL 10 processing apparatus
20 power supply monitoring unit
30 processing unit
100 processing apparatus
110 voltage application unit
120 voltage monitoring unit
130 input-output unit
140 non-volatile memory unit
150 processing unit.
200 sensor apparatus
210 voltage control unit
211 voltage acquisition unit
212 voltage monitoring unit
213 voltage application unit
220 sensor unit
230 output unit
240 non-volatile memory unit
250 processing unit
251 information acquisition unit
252 information transmission unit
253 operation switching unit
500 power line
600 alternating current power line

What is claimed is:

1. A processing apparatus, comprising:
a processing device; and
a sensor device, in connection with an external power supply, which monitors power supplied from the power supply and, upon detection that a measured value of the power supplied by the power supply is at least a first value necessary for a first processing by the processing device, outputs a first notification to the processing device,
the power supplied by the power supply being asynchronous with operations of the processing apparatus, and the power supply supplying the power at least the first value for at least the first period,
the processing device configured to be energized with the power supplied from the power supply, said processing device configured to, when the first notification is received, perform and complete the first processing within the first period by switching from a standby state to a first operation state in which the first processing is performed,
the standby state being a mode of operation of the processing device wherein power of at least the first value is not needed,
wherein the processing device:
switches, upon reception of the first notification from the sensor device, from the standby state wherein power of at least the first value is not needed, to the first operation state,
completes the first processing within the first period,
switches to a second operation state in which a second processing is performed, said second processing being performed when the first processing is completed, and said second processing being stoppable the course of said second processing, and
when the power supplied by the power supply falls below the first value, stops the second processing of the second operation state and switches to the standby state from the second operation state.

2. The processing apparatus according to claim 1, wherein the processing device repeats the first processing at least two times in the first operation state.

3. The processing apparatus according to claim 2, further comprising:
an output unit that outputs a processing result of the first processing,
wherein the processing device transmits the processing result of the first processing to the output unit while in the first operation state.

4. The processing apparatus according to claim 2, further comprising:
an environmental sensor unit senses a condition of an environment local to the sensor unit and generates an output corresponding to said sensed condition to the processing device,
wherein the first processing comprises processing the data received from the environmental sensor unit.

5. The processing apparatus according to claim 2, wherein the sensor device outputs a second notification upon detection that the power supplied by the power supply becomes a predetermined ratio value of the first value, and wherein the processing device performs a second processing, with less power consumption than the first processing, upon receiving the second notification, and starts the first processing after the second period has completed.

6. The processing apparatus according to claim 1, further comprising:
an output unit that outputs a processing result of the first processing,
wherein the processing device transmits the processing result of the first processing to the output unit while in the first operation state.

7. The processing apparatus according to claim 6, further comprising:
an environmental sensor unit senses a condition of an environment local to the sensor unit and generates an output corresponding to said sensed condition to the processing device,
wherein the first processing comprises processing the data received from the environmental sensor unit.

8. The processing apparatus according to claim 6,
wherein the sensor device outputs a second notification upon detection that the power supplied by the power supply becomes a predetermined ratio value of the first value, and
wherein the processing device performs a second processing, with less power consumption than the first processing, upon receiving the second notification, and starts the first processing after the second period has completed.

9. The processing apparatus according to claim 6,
wherein the power supplied from the power supply is transmitted to the sensor device via a power line, and
wherein the output unit outputs the processing result via the power line.

10. The processing apparatus according to claim 9, further comprising:
an environmental sensor unit senses a condition of an environment local to the sensor unit and generates an output corresponding to said sensed condition to the processing device,
wherein the first processing comprises processing the data received from the environmental sensor unit.

11. The processing apparatus according to claim 1, further comprising:
an environmental sensor unit senses a condition of an environment local to the sensor unit and generates an output corresponding to said sensed condition to the processing device,
wherein the first processing comprises processing the data received from the environmental sensor unit.

12. The processing apparatus according to claim 11,
wherein the output of the environmental sensor unit is generated as a voltage, and the processing device starts the first processing when the voltage outputted from the environmental sensor unit becomes at least a predetermined voltage value after receiving the first notification.

13. The processing apparatus according to claim 1,
wherein the sensor device outputs a second notification upon detection that the power supplied by the power supply becomes a predetermined ratio value of the first value, and
wherein the processing device performs a second processing, with less power consumption than the first processing, upon receiving the second notification, and starts the first processing after the second period has completed.

14. The processing apparatus according to claim 1,
wherein the sensor device measures a voltage provided by the power supply, and determines that the supplied power equals or exceeds the first value when a value of the voltage is at least a predetermined voltage value corresponding to the first value.

15. A processing method, comprising:
monitoring, via a sensor device, power supplied from a power supply for at least a first period, a power of at least a first value being necessary for a first processing;
outputting, from the sensor device to a processing device, a first notification when the supplied power is determined to be at least the first value; and
performing, at the processing device, the first processing when the first notification is outputted and completing the first processing within a span of the first period, the processing device switching from a standby state, in which supplying of a power of at least the first value is not needed, to a first operation state sufficient for performing the first processing,
wherein the processing device:
switches, upon reception of the first notification from the sensor device, from the standby state wherein power of at least the first value is not needed, to the first operation state,
completes the first processing within the first period,
switches to a second operation state, in which a second processing, which is a processing which can be stopped while processing and is performed when the first processing is completed, and
when the power supplied by the power supply falls below the first value, stops the second operation state and switches to the standby state from the second operation state.

* * * * *